(12) United States Patent
Braun et al.

(10) Patent No.: US 10,665,712 B2
(45) Date of Patent: May 26, 2020

(54) LDMOS DEVICE WITH A FIELD PLATE CONTACT METAL LAYER WITH A SUB-MAXIMUM SIZE

(71) Applicant: Monolithic Power Systems Co., Ltd., San Jose, CA (US)

(72) Inventors: Eric Braun, Mountain View, CA (US); Joel McGregor, Kirkland, WA (US); Jeesung Jung, San Ramon, CA (US)

(73) Assignee: Monolithic Power Systems, Inc., San Jose, CA (US)

( * ) Notice: Subject to any disclaimer, the term of this patent is extended or adjusted under 35 U.S.C. 154(b) by 0 days.

(21) Appl. No.: 16/122,836

(22) Filed: Sep. 5, 2018

(65) Prior Publication Data

US 2020/0075760 A1    Mar. 5, 2020

(51) Int. Cl.
*H01L 29/78* (2006.01)
*H01L 29/40* (2006.01)
*H01L 29/66* (2006.01)
*H01L 21/8238* (2006.01)
*H01L 29/08* (2006.01)

(52) U.S. Cl.
CPC .. *H01L 29/7816* (2013.01); *H01L 21/823871* (2013.01); *H01L 29/086* (2013.01); *H01L 29/0865* (2013.01); *H01L 29/0878* (2013.01); *H01L 29/0882* (2013.01); *H01L 29/402* (2013.01); *H01L 29/66681* (2013.01)

(58) Field of Classification Search
CPC ......... H01L 29/66681; H01L 29/7816; H01L 29/7824; H01L 29/66613; H01L 29/402; H01L 29/66568
See application file for complete search history.

(56) References Cited

U.S. PATENT DOCUMENTS

2013/0277741 A1    10/2013  Guowei et al.
2016/0111502 A1*   4/2016   Hagleitner .......... H01L 29/4958
                                                    257/409
2017/0352731 A1*  12/2017   Kuo .................... H01L 29/401

OTHER PUBLICATIONS

M. Lee, O. Kwon, "High Performance Extended Drain MOSFETs (EDMOSFETs) with Metal Field Plate", *Pm. IEEE ISPSD*, pp. 249-252, 1999.
L. Wei, C. Chao, U. Singh, R. Jain, L. Goh, P. Verma, "A novel contact field plate application in drain-extended-MOSFET transistors", ISPSD 2017, pp. 335-337.

* cited by examiner

*Primary Examiner* — Hsien Ming Lee
(74) *Attorney, Agent, or Firm* — Perkins Coie LLP

(57) ABSTRACT

An LDMOS device with a field plate contact having a field plate contact metal layer being positioned above the field plate contact. The field plate contact metal layer has a sub-maximum size satisfied for the electrical connection between the field plate contact and an external applying voltage. This sub-maximum size is prescribed by the physical limitation of the LDMOS device. The field plate contact metal layer extends a sub-maximum length from one edge toward to the other edge of the field plate contact.

17 Claims, 3 Drawing Sheets

LDMOS DEVICE WITH A FIELD PLATE CONTACT METAL LAYER WITH A SUB-MAXIMUM SIZE

FIELD OF THE INVENTION

The present invention relates generally to LDMOS device, and more particularly but not exclusively to LDMOS devices with a field plate contact and a field plate contact metal layer.

BACKGROUND OF THE INVENTION

Field plates of various constructions have been embedded within semiconductor devices to effectively reduce the peak electric field at a given voltage, or equivalently to increase the breakdown voltage where the critical electric field is reached. Such field plates have been used for various devices, including LDMOS (Lateral Diffused Metal-Oxide-Semiconductor) transistors. FIG. 1 is a schematically depicted plan view of various portions of a traditional LDMOS device 00. The LDMOS device 00 comprises a field plate contact 01 above a field plate (not shown) and a field plate contact metal layer 02 positioned above the field plate contact 01. The field plate contact 02 is in parallel with a drain contact 02 in the longitudinal direction. A drain contact metal layer 04 is positioned above the drain contact 03. The field plate contact 01 comprises two edges E1 and E2 in the lateral direction and the field plate contact metal layer 02 extends from one edge E1 to the other edge E2 of the field plate contact 01 for realizing the electrical connectivity between the field plate contact 01 and an external applying voltage.

One issue with the above configuration is that the parallel field plate contact metal layer 02 and drain contact metal layer 04 generate fringing fields which result parasitic capacitances therebetween and thus causes associated power loss and efficiency reduction for the switching operation of the LDMOS device.

Thus, an LDMOS device with a configuration that at least addresses the above issue is desired.

SUMMARY

Embodiments of the present invention are directed to a novel LDMOS device, comprising: a source region and a drain region formed in a substrate; a gate positioned above the substrate, the gate being laterally positioned between the source region and the drain region; a field plate positioned above the substrate, the field plate being positioned between the gate and the drain region; a field plate contact positioned above the field plate, wherein the field plate contact comprises a top surface comprising a first portion and a second portion along the longitudinal direction; and a field plate contact metal layer conductively coupled to the top surface of the field plate contact, wherein the field plate contact metal layer covers only the first portion of the field plate contact.

Embodiments of the present invention are also directed to an LDMOS device, comprising: a source region and a drain region formed in a substrate; a gate positioned above the substrate, the gate being laterally positioned between the source region and the drain region; a field plate positioned above the substrate, the field plate being positioned between the gate and the drain region; a field plate contact positioned above the field plate; and a field plate contact metal layer conductively coupled to the field plate contact, wherein the field plate contact metal layer has a sub-maximum size prescribed by a physical limitation of the LDMOS device.

Embodiments of the present invention are also directed to a method for forming an LDMOS device, comprising: forming a source region and a drain region in a substrate; forming a gate above the substrate and between the source region and the drain region; forming a field plate above the substrate and between the gate and the drain region; forming a field plate contact above the field plate, wherein the field plate contact comprises a top surface comprising a first portion and a second portion along the longitudinal direction; and forming a field plate contact metal layer above the field plate contact, wherein the field plate contact metal layer covers only the first portion of the field plate contact.

DESCRIPTION OF THE DRAWINGS

The present invention can be further understood with reference to the following detailed description and the appended drawings, wherein like elements are provided with like reference numerals.

DESCRIPTION

Figure 1:
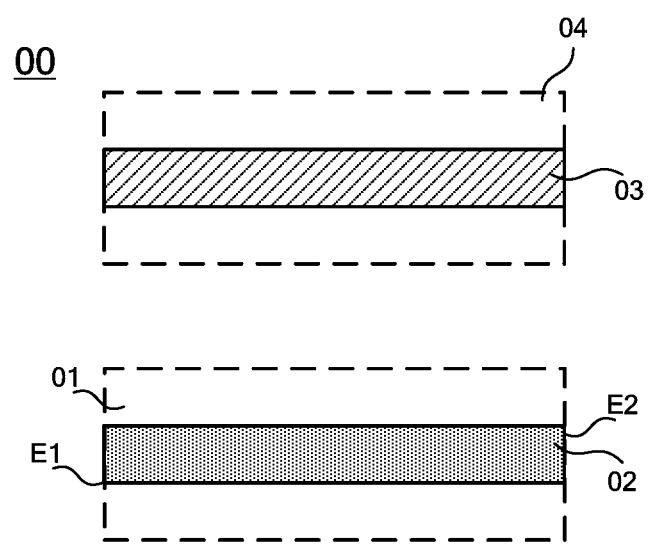
FIG. 1 is a schematically depicted plan view of various portions of a traditional LDMOS device 00.

The present invention is now described. While it is disclosed in its preferred form, the specific embodiments of the invention as disclosed herein and illustrated in the drawings are not to be considered in a limiting sense. Rather, these embodiments are provided so that this invention will be thorough and complete, and will fully convey the scope of the invention to those skilled in the art. Indeed, it should be readily apparent in view of the present description that the invention may be modified in numerous ways. Among other things, the present invention may be embodied as devices, methods, software, and so on. Accordingly, the present invention may take the form of an entirely hardware embodiment, an entirely software embodiment or an embodiment combining software and hardware aspects. The following detailed description is, therefore, not to be taken in a limiting sense.

Throughout the specification, the meaning of "a," "an," and "the" may also include plural references.

The present invention is directed to various embodiments of a novel LDMOS (Laterally Diffused Metal Oxide Semiconductor) device with a novel field effect structure and a method of making such an LDMOS device. As will be readily apparent to those skilled in the art upon a complete reading of the present application, the present method is applicable to a variety of devices, including, but not limited to, logic devices, memory devices, etc. With reference to FIGS. 2A-2B, 3 and 4, various illustrative embodiments of the devices and the method disclosed herein will now be described in more detail.

Figure 2A:
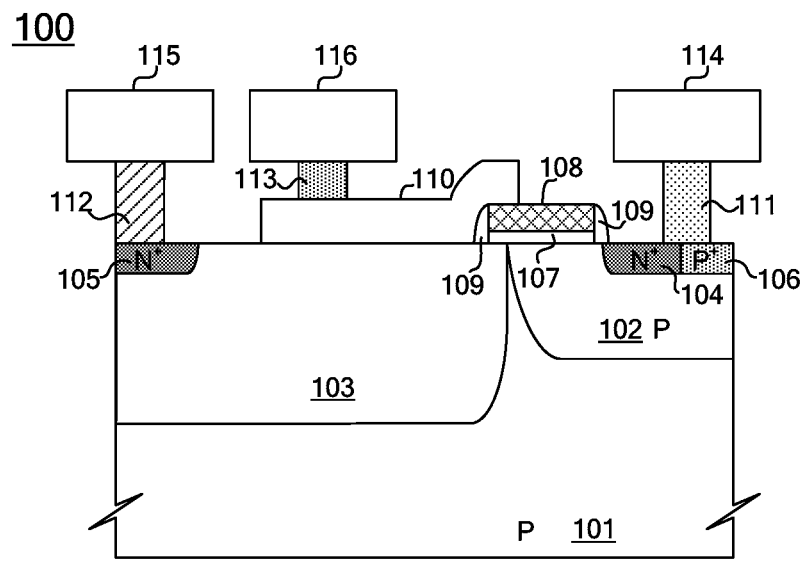
FIG. 2A and FIG. 2B schematically depict a novel LDMOS device 100 in accordance with an embodiment of the present invention.
Figure 2B:
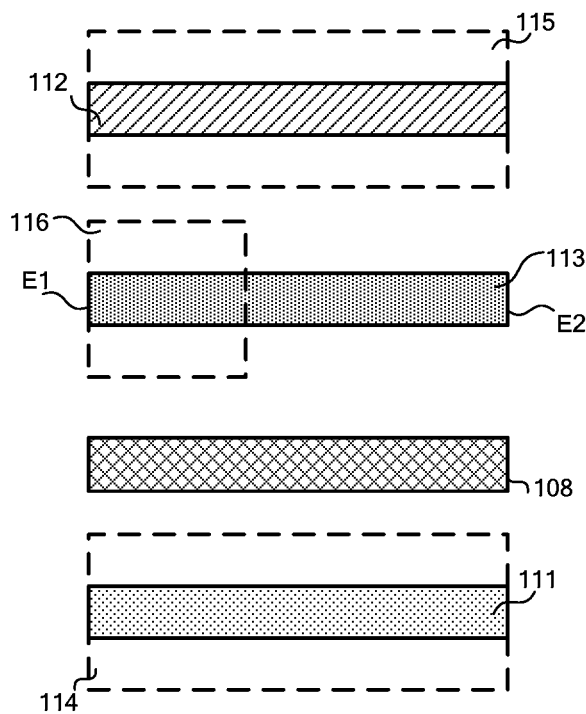

FIG. 2A and FIG. 2B schematically depict a novel LDMOS device 100 in accordance with an embodiment of the present invention. In more detail, FIG. 2A is a cross-sectional view of such an LDMOS device 100 and FIG. 2B is a schematically depicted plan view of various portions of such an LDMOS device 100. As shown in FIG. 2A, the LDMOS device 100 of FIG. 2A is illustrated to comprise a semiconducting substrate 101, such as a silicon substrate having a bulk or so-called silicon-on-insulator (SOI) configuration. Of course, the substrate 101 may be comprised of a variety of materials other than silicon, depending upon the particular application. In one illustrative embodiment, the LDMOS device 100 disclosed herein is also configured to comprise a P-well region 102, an N-doped drift region 103, an N+ doped source region 104, an N+ doped drain region 105 and a P+ doped well tap 106 that may be formed in the substrate 101 by traditional techniques.

Persons of ordinary skill in the art will recognize that the N type LDMOS device 100 comprising the above various regions with the illustrative doping conductivity types is illustrated for exemplary purpose, the structures presented in the present invention may be also applied in a P type LDMOS device with the various regions having opposite conductivity types to that of the N type LDMOS device 100.

The illustrative LDMOS device 100 is further configured to comprise a gate which comprises a gate insulation layer 107, a gate electrode 108 and sidewall spacers 109. The gate is generally laterally positioned between the source region 104 and the drain region 105 so as to establish a channel under the gate electrode 108. Persons of ordinary skill in the art will recognize that in one embodiment, the spacers 109 may be omitted from the gate, yet in another embodiment, more regions may be comprised by the gate, such as a plurality of metal silicide regions.

As shown in FIG. 2A, the LDMOS device 100 is further configured to comprise a field plate 110, such as a silicide field plate, which is positioned above the N-doped drift region 103 and between the N+ doped drain region 105 and the gate of the LDMOS device 100. In the illustrative embodiment, the field plate 110 extends to but separated from the N+ doped drain region 105 and is positioned above a portion of the gate electrode 108. In another embodiment, depending upon the particular design, the field plate 110 may extend all of the way to the N+ doped drain region 105. In yet another embodiment, the field plate 110 do not necessarily positioned above a portion of the gate electrode 108. In some applications, the field plate 110 may be formed so as to have a greater thickness than traditional prior art field plates so as to insure that the field plate contact 113 that is positioned above the field plate 110 (will be apparent later) do not reach the underlying N-drift region 103.

In one embodiment, the LDMOS device 100 may comprise a field plate stop layer positioned between the substrate 101 and the field plate 110 to insulate the field plate 110 and the substrate 101. In one embodiment, the field plate stop layer may be a pad oxide layer, such as a layer of silicon dioxide.

The LDMOS device 100 is further configured to comprise a source contact 111, a drain contact 112 and a field plate contact 113 which are respectively electrically coupled to the source region 104, the drain region 105 and the field plate 110. In the illustrative embodiment of FIG. 2A, the source contact 111 is also positioned on a portion of the P+ doped well tap 106. Furthermore, a source metal layer 114, a drain metal layer 115 and a field plate contact metal layer 116 are comprised to be respectively positioned on the source contact 111, the drain contact 112 and the field plate contact 113. The source contact 111 and the source metal layer 114 are coupled to a relatively low voltage ("$V_{LOW}$"), while the drain contact 112 and the drain metal layer 115 are coupled to a relatively higher voltage ("$V_{HIGH}$"). In one illustrative embodiment, the $V_{LOW}$ voltage may be about 0 volts while the $V_{HIGH}$ voltage may be about dozens of volts. Of course, the absolute values for the applied voltages $V_{LOW}$ and $V_{HIGH}$ may vary depending upon the particular application. In the depicted example, the source contact 111 and the source metal layer 114 are electrically coupled to the source region 104 and the P+ doped well tap 106 for coupling the source region 104 and the P+ doped well tap 106 to the same relatively low voltage. However, persons of ordinary skill in the art will recognize that in yet another embodiment, the P+ doped well tap 106 may have a separate contact as well as a separate metal layer being formed thereon other than sharing the source contact 111 and the source metal layer 114 with the source region 104. And the separate contact and metal layer are coupled to another relatively low voltage differentiating from the voltage applied on the source contact 111 and the source metal layer 114, as compared to the voltage applied to the drain contact 112 and the drain metal layer 115.

FIG. 2B is a schematically depicted plan view of portions of the LDMOS device 100 depicted in FIG. 2A. As shown therein, the drain contact 112, the drain metal layer 115, the field plate contact 113 and the field plate contact metal layer 116, the source contact 111 and the source metal layer 114 are formed above the substrate 101 (which are not depicted in FIG. 2B). The gate electrode 108 is also depicted in FIG. 2B for reference purposes. The configuration of the illustrative source metal layer 114, drain metal layer 115 and field plate contact metal layer 116 are depicted by dashed lines in FIG. 2B so as to respectively show the source contact 111, the drain contact 112 and the field plate contact 113 positioned underneath the source metal layer 114, the drain metal layer 115 and the field plate contact metal layer 116. The various doped regions and field plate are not depicted in FIG. 2B so as to avoid confusion and simplify the presentation. As shown in FIGS. 2A and 2B, the field plate contact metal layer 116 is conductively coupled to the field plate contact 113. In the illustrative embodiment, the field plate contact metal layer 116 covers a portion of the field plate contact 113 other than the whole area in the longitudinal direction, and the remaining portion of the field plate contact 113 is bare, without any coverage by the field plate contact metal layer 116. As shown in FIGS. 2A and 2B, the source metal layer 114 extends laterally beyond both sides of the source contact 111, the field plate contact metal layer 116 extends laterally beyond both sides of the field plate contact 113, and the drain metal layer 115 extends laterally beyond both sides of the drain contact 112. However, in another embodiment, the source metal layer 114 may extend equal to both sides of the source contact 111 laterally, the field plate contact metal layer 116 may extend equal to both sides of the field plate contact 113 laterally, and the drain metal layer 115 may extend equal to both sides of the drain contact 112 laterally. In yet another embodiment, the source metal layer 114 may be inside the source contact 111 laterally, the field plate contact metal layer 116 may be inside the field plate contact 113 laterally, and the drain metal layer 115 may be inside the drain contact 112 laterally. The field plate contact metal layer 116 has a sub-maximum size that is satisfied for the electrical connection between the field plate contact metal layer 116 and an external applying voltage. The sub-maximum size is a size which is smaller than the maximum size of the field plate contact metal layer that at least covers the whole area of the field plate contact. In one embodiment, this sub-maximum size is prescribed by the physical limitation of the LDMOS device 100, such as the resistance and the electro-migration of the field plate contact 113 and of the field plate contact metal layer 116 of the LDMOS device 100. In one embodiment, the field plate contact 113 has a rectangular top surface which comprises two lateral edges E1 and E2, and the field plate contact metal layer 116 extends from one edge E1 toward to the other edge E2 of the field plate contact 113 in the longitudinal direction but does not reach the other edge E2. In contrast, as shown in FIG. 2B, the source metal layer 114 extends from one end all of the way to the other end of the drain contact 112 in the longitudinal direction, similarly, the drain metal layer 115 extends from one end all of the way to the other end of the source contact 111 in the longitudinal direction. But of course, in another embodiment, the source metal layer 114 may not reach the other end of the drain contact 112 in the longitudinal direction, similarly, the drain metal layer 115 may not reach the other end of the source contact 111 in the longitudinal direction.

Persons of ordinary skill in the art will recognize that the LDMOS device 100 as shown in FIG. 2A-2B has only one field plate contact 113, however, in another embodiment, the field plate contact comprises a plurality of individual structures and the field plate contact metal layer is conductively coupled to the plurality of individual structures.

In the LDMOS device 100, the field plate contact 113 acts to position a lower electrical potential nearer to the N+ doped drain region 105 of the LDMOS device 100 and thereby more effectively force the high electrical fields that are normally present near the drain side edge of the gate electrode 108 farther away from the gate electrode 108 toward the N+ doped drain region 105. In this manner, the peak electric field is effectively reduced and equivalently, the breakdown voltage of the LDMOS device 100 is increased.

The field plate contact metal layer 116 serves to provide electrical coupling between the field plate contact 113 and an external applying voltage. The traditional large-size field plate contact metal layer adds large fringing fields and results a large parasitic capacitance between the parallel drain metal layer and field plate contact metal layer. In the proposed configuration, the field plate contact metal layer 116 has a sub-maximum size which helps to reduce the fringing fields and thereby the parasitic capacitances associated with the field plate contact metal layer 116, most significantly the parasitic capacitance formed between the parallel drain metal layer 115 and field plate contact metal layer 116, but also other parasitic capacitances between the field plate contact metal layer 116 and other nearby metal, poly and silicon conductors, etc. Reducing these capacitances has the benefit of reduced power loss and of enhanced efficiency gain for switching operation of the LDMOS device 100.

A second benefit of the proposed configuration is that it allows for smaller drain contact to field plate contact spacing by eliminating the metal-metal line and space constraint due to the reduced field plate contact metal layer. Thus, the LDMOS device 100 of the present invention enables smaller drain to source pitch and thereby lower resistance and lower ohmic losses for solutions that can tolerate the associated lower breakdown voltage.

On the other hand, as the field plate contact metal layer 116 makes no contribution on reducing the electrical fields or enhancing the breakdown voltage of the LDMOS device 100, the performance of the breakdown voltage and of the on-resistance of the LDMOS device 100 will not be affected by the reduced field plate contact metal layer 116.

Figure 3:
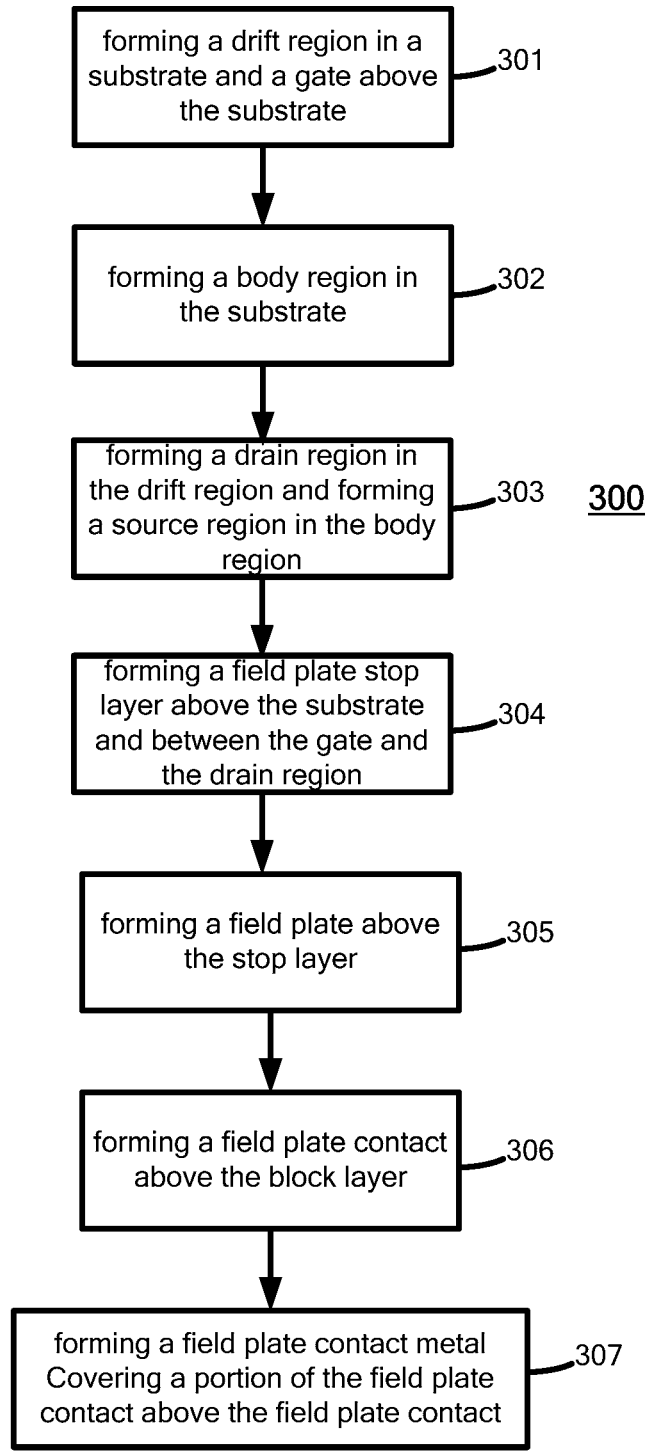
FIG. 3 illustrates an exemplary method 300 for forming an LDMOS device in accordance with an embodiment of the present invention.

FIG. 3 illustrates an exemplary method 300 for forming an LDMOS device in accordance with an embodiment of the present invention. As shown in FIG. 3, the method 300 for forming the LDMOS device is illustrated to comprise steps 301-307. In detail, step 301 comprising forming a drift region in a substrate and a gate above the substrate. Step 302 comprises forming a body region in the substrate, wherein the body region is formed partially under the gate. Step 303 comprises forming a drain region in the drift region and forming a source region in the body region. Step 304 comprises forming a field plate stop layer above the substrate and between the gate and the drain region. In one embodiment, the field plate stop layer is a pad oxide layer, such as a layer of silicon dioxide. Step 305 comprises forming a field plate above the field plate stop layer. In an alternative embodiment, step 304 may be omitted, and step 305 may comprise forming a field plate above the substrate and between the gate and the drain region instead. Step 306 comprises forming a field plate contact above the field plate, wherein the field plate contact comprises a top surface comprising a first portion and a second portion along the longitudinal direction. In one embodiment, the field plate contact is formed to be proximate to the drain contact. In another embodiment, the field plate contact comprises a plurality of individual structures and the field plate contact metal layer is conductively coupled to the plurality of individual structures. Step 307 comprises forming a field plate contact metal layer above the field plate contact, wherein the field plate contact metal layer covers only the first portion of the field plate contact. In one embodiment, the top surface of the field plate contact has a rectangular shape and the first portion is the portion extending from one edge of the rectangular shape along the longitudinal direction. In another embodiment, the field plate contact metal layer has a sub-maximum size prescribed by a physical limitation of the LDMOS device above the field plate contact. The sub-maximum size is a size which is smaller than the maximum size of the field plate contact metal layer that at least covers the whole area of the field plate contact. In one embodiment, the physical limitation of the LDMOS device comprises the resistance of the field plate contact and the electro-migration of the LDMOS device. In another embodiment, the physical limitation of the LDMOS device is determined by a requirement of the electrical connectivity between the field plate contact metal layer an external applying voltage. In yet another embodiment, the field plate contact metal layer is formed to cover only a portion of the field plate contact.

In one embodiment, the method 300 further comprises forming a drain contact above the drain region and further forming a drain metal layer above the drain contact, wherein the drain contact is separated from the field plate contact and the drain metal layer is separated from the field plate contact metal layer. In one embodiment, the method 300 further comprises forming a source contact above the source region and forming a source metal layer above the source contact, wherein the source contact is separated from the gate and the source metal layer is separated from the field plate contact metal layer.

It will be appreciated by persons skilled in the art that the present invention is not limited to what has been particularly shown and described herein above. Rather the scope of the present invention is defined by the claims and includes both combinations and sub-combinations of the various features described hereinabove as well as variations and modifications thereof which would occur to persons skilled in the art upon reading the foregoing description and which are not in the prior art.

What is claimed is:

1. An LDMOS device, comprising:
a source region and a drain region formed in a substrate;

a gate positioned above the substrate, the gate being laterally positioned between the source region and the drain region;

a field plate positioned above the substrate, the field plate being positioned between the gate and the drain region;

a field plate contact positioned above the field plate, wherein the field plate contact comprises a top surface comprising a first portion and a second portion along the longitudinal direction; and a field plate contact metal layer conductively coupled to the top surface of the field plate contact, wherein the field plate contact metal layer covers only the first portion of the field plate contact.

2. The LDMOS device of claim 1, wherein the top surface of the field plate contact has a rectangular shape and the first portion is the portion extending from one edge of the rectangular shape along the longitudinal direction.

3. The LDMOS device of claim 1, wherein the field plate contact comprises a plurality of individual structures and the field plate contact metal layer is conductively coupled to the plurality of individual structures.

4. The LDMOS device of claim 1, wherein the LDMOS device further comprises a field plate stop layer positioned between the field plate and the substrate and between the gate and the drain region.

5. The LDMOS device of claim 1, wherein the LDMOS device further comprises:

a drain contact positioned above the drain region and separated from the field plate contact; and a drain metal layer conductively coupled to the drain contact, wherein the drain metal layer is separated from the field plate contact metal layer.

6. The LDMOS device of claim 5, wherein the field plate contact is in proximity to the drain contact.

7. The LDMOS device of claim 1, wherein the LDMOS device further comprises:

a source contact positioned above the source region and separated from the gate; and a source metal layer conductively coupled to the source contact.

8. An LDMOS device, comprising:

a source region and a drain region formed in a substrate;

a gate positioned above the substrate, the gate being laterally positioned between the source region and the drain region;

a field plate positioned above the substrate, the field plate being positioned between the gate and the drain region;

a field plate contact positioned above the field plate; and a field plate contact metal layer conductively coupled to the field plate contact, wherein the field plate contact metal layer covers only a portion of the field plate contact in the longitudinal direction.

9. The LDMOS device of claim 8, wherein the field plate contact comprises a plurality of individual structures and the field plate contact metal layer is conductively coupled to the plurality of individual structures.

10. The LDMOS device of claim 8, wherein the LDMOS device further comprises:

a drain contact positioned above the drain region and separated from the field plate contact; and a drain metal layer conductively coupled to the drain contact, wherein the drain metal layer is separated from the field plate contact metal layer.

11. The LDMOS device of claim 10, wherein the field plate contact is in proximity to the drain contact.

12. A method for forming an LDMOS device, comprising:

forming a drift region in a substrate and a gate above the substrate;

forming a body region in the substrate, wherein the body region is partially under the gate;

forming a drain region in the drift region and forming a source region in the body region;

forming a field plate above the substrate and between the gate and the drain region;

forming a field plate contact above the field plate, wherein the field plate contact comprises a top surface comprising a first portion and a second portion along the longitudinal direction; and forming a field plate contact metal layer above the field plate contact, wherein the field plate contact metal layer covers only the first portion of the field plate contact.

13. The method of claim 12, wherein the top surface of the field plate contact has a rectangular shape and the first portion is the portion extending from one edge of the rectangular shape along the longitudinal direction.

14. The method of claim 12, wherein the method further comprises:

forming a drain contact above the drain region, wherein the drain contact is separated from the field plate contact; and forming a drain metal layer above the drain contact, wherein the drain metal layer is separated from the field plate contact metal layer.

15. The method of claim 14, wherein the field plate contact is formed in proximity to the drain contact.

16. The method of claim 12, wherein the field plate contact is formed to comprise a plurality of individual structures and the field plate contact metal layer is formed to be conductively coupled to the plurality of individual structures.

17. The method of claim 12, wherein the method further comprises forming a field plate stop layer above the substrate and between the gate and the drain region, and wherein the field plate is formed above the field plate stop layer.

\* \* \* \* \*